United States Patent

Lee

[11] Patent Number: 5,835,407
[45] Date of Patent: Nov. 10, 1998

[54] FLASH MEMORY DEVICE

[75] Inventor: Poong Yeub Lee, Ichon-shi, Rep. of Korea

[73] Assignee: Hyundai Electronics Industries Co., Ltd., Kyungki-Do, Rep. of Korea

[21] Appl. No.: 998,968

[22] Filed: Dec. 29, 1997

[30] Foreign Application Priority Data

Dec. 28, 1996 [KR] Rep. of Korea ............... 96-75001

[51] Int. Cl.[6] .................................................. G11C 16/06
[52] U.S. Cl. .................................. 365/185.09; 365/200
[58] Field of Search .................. 365/185.09, 185.33, 365/200, 225.7, 230.02, 230.06, 189.07

[56] References Cited

U.S. PATENT DOCUMENTS 5,471,426  11/1995  McClure ................................. 365/200
5,485,425   1/1996  Iwai et al. ............................. 365/200
5,696,723  12/1997  Tukahara ............................... 365/200
5,737,269   4/1998  Fujita .................................... 365/200

*Primary Examiner*—Son Mai
*Attorney, Agent, or Firm*—Scott C. Harris, Esq.

[57] ABSTRACT

A flash memory device according to this invention comprises a main cell array block consisted of a main cell array and a dummy cell array; a first and second multiplex blocks to which data of the main cell array are input; a first and second column multiplex blocks to which data of the main cell array block are input; a first and second repair multiplexers to control the first and second multiplex blocks; a third to fifth repair multiplexers to control the first and second column multiplex blocks; a first to fifth decoders to access said main cell array of the cell array block according to an address input; a sixth and seventh decoders to access repair cell array of the cell array block according to the address input; and a redundancy fuse block comparing the inputted address with repair address and determining whether repair be done or not.

2 Claims, 3 Drawing Sheets

FLASH MEMORY DEVICE

BACKGROUND OF THE INVENTION

1. Field of the Invention

This invention relates to a flash memory device, and more particularly to the flash memory device in which a fail cell can be repaired in a column direction by means of a repair cell and fuse block.

2. Description of the Prior Arts

Generally, when a column repair is performed, an address is changed into a specific address to perform Y-decoding and Z-decoding. The specific address is inputted to Y-decoder or Z-decoder, whereby the specific address is decoded again. The decoded address enables a Y-multiplexer and a repair cell is selected by an output of the Y-multiplexer. The specific address is generated by comparing a repair with the normal address. Accordingly, there is a disadvantage in that access time of the repair cell increases.

SUMMARY OF THE INVENTION

Therefore, the object of this invention is to provide a flash memory device which can decrease the access time of repair cell.

A flash memory device according to this invention comprises a main cell array block consisted of a main cell array and a dummy cell array; a first and second multiplex blocks to which data of the main cell array are input; a first and second column multiplex blocks to which data of the main cell array block are input; a first and second repair multiplexers to control the first and second multiplex blocks; a third to fifth repair multiplexers to control the first and second column multiplex blocks; a first to fifth decoders to access said main cell array of the cell array block according to an address input; a sixth and seventh decoders to access repair cell array of the cell array block according to the address input; and a redundancy fuse block comparing the inputted address with repair address and determining whether repair will be done or not.

The redundancy fuse block comprises a redundancy decoder to which an inputted address inputted and the repair address of fuse block are input; and an OR gate comparing two addresses outputted the redundancy decoder and judging whether match is done or not and outputting repair signal.

BRIEF DESCRIPTION OF THE DRAWINGS

Other objects and advantages of the present invention will be understood by the detailed explanation of the embodiment with reference to the accompanying drawings in which.

DETAILED DESCRIPTION OF THE INVENTION

Figure 1:
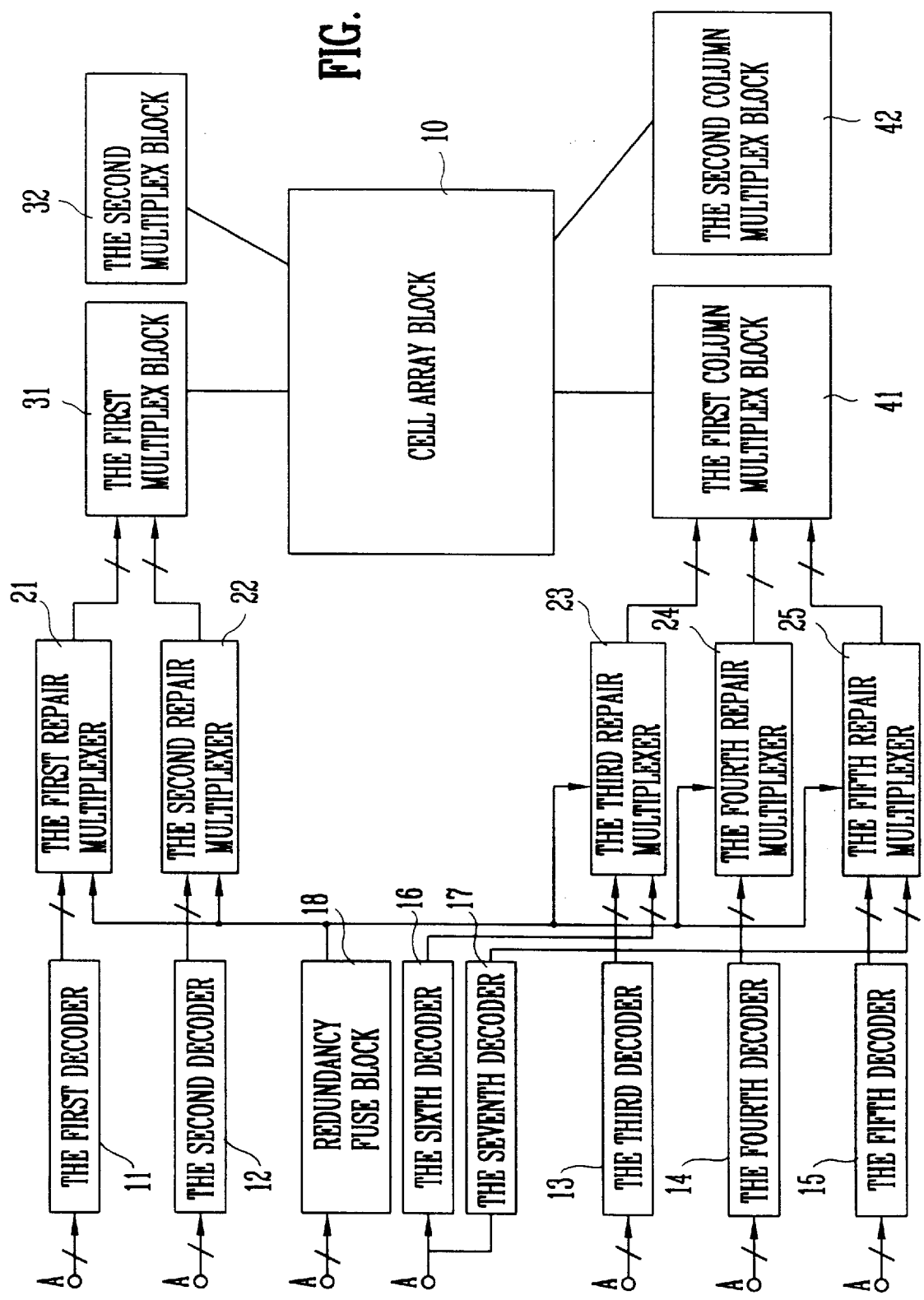
FIG. 1 is a block diagram of a flash memory device according to the present invention.

FIG. 1 is a block diagram of a flash memory device according to the present invention. The flash memory device of the present invention comprises a cell array block 10 consisted of main cell arrays and dummy cell arrays, a first and second multiplex blocks 31 and 32 to which data of the cell array block 10 is input, a first and second column multiplex blocks 41 and 42 to which data of the cell array block 10 is input. Also, the flash memory device of the present invention further comprises a first and second repair multiplexers 21 and 22 to control the first and second multiplex blocks 31 and 32, a third to fifth repair multiplexers 23 to 25 to control the first and second column multiplex blocks 41 and 42, a first to fifth decoders 11 to 15 to access a main cell in the cell array block 10 in response to an address input, a sixth and seventh decoders 16 and 17 to access the repair cell in the cell array block 10 in response to an address input, and a redundancy fuse block 18 deciding whether repair will be done or not with comparing address of fail cell and address of repair cell.

The first decoder 11 selects one of eight multiplexers of the first multiplex block 31, and the second decoder 12 selects only one of eight control gates in the selected multiplexer. The first and second decoders 11 and 12 access the main cell array and dummy cell array of the cell array block 10 through the first and second repair multiplexers 21 and 22 according to whether repair signal is input or not.

The redundancy fuse block 18 is a unit memory in which the address being able to repair are previously stored, and is a comparing block which compares the stored repair address with input address and decides whether repair will be done or not.

The fourth decoder 14 is used to select any one multiplexer of the first column multiplex block 41 to which main cell array data of the cell array block 10 is input/output through the fourth repair multiplexer 24. The third and fifth decoder 13 and 15 are used for outputting a control signal to select a bit line of a plurality of bit lines of one block in the first column multiplex block 41 which is selected by the fourth decoder 14 through the third and fifth repair multiplexers 23 and 25.

The sixth and seventh decoders 16 and 17 are used for outputting a control signal which will be required when a repair cell in the cell array block 10 accesses through the third and fifth repair multiplexers 23 and 25.

In the flash memory device, signals ZB<7:0>, ZA<7:0>, YA<15:1:2>, YG<14:0:2>, YB<7:0>, YAEVEN, YAODD, YGEVEN, YGODD generated to access the main cell array and signals YA_REP<15:3:1:2>, YG_REP<14:0:2>, YAEVEN_REP, YAODD_REP, YGEVEN_REP, YGODD_REP generated to access the repair cell array are generated simultaneously after the address is inputted, and a decoding operation is executed. At the same time, the redundancy fuse block 18 compares and decides whether repair is done or not and then generates a repair signal.

In order to access the main cell array and dummy cell array, the first to fifth repair multiplexer 21 to 25 select signals ZB'<7:0>, ZB_REP', ZA'<7:0>, ZA_REP', YA'<15:1:2>, YG'<14:0:2>, YB'<7:0>, YB_REP', YAEVEN', YAODD', YGEVEN', YGODD' which are input to the first multiplex block 31 and the first column multiplex block 41 according to the repair signal generated at the redundancy fuse block 18.

Figure 2:
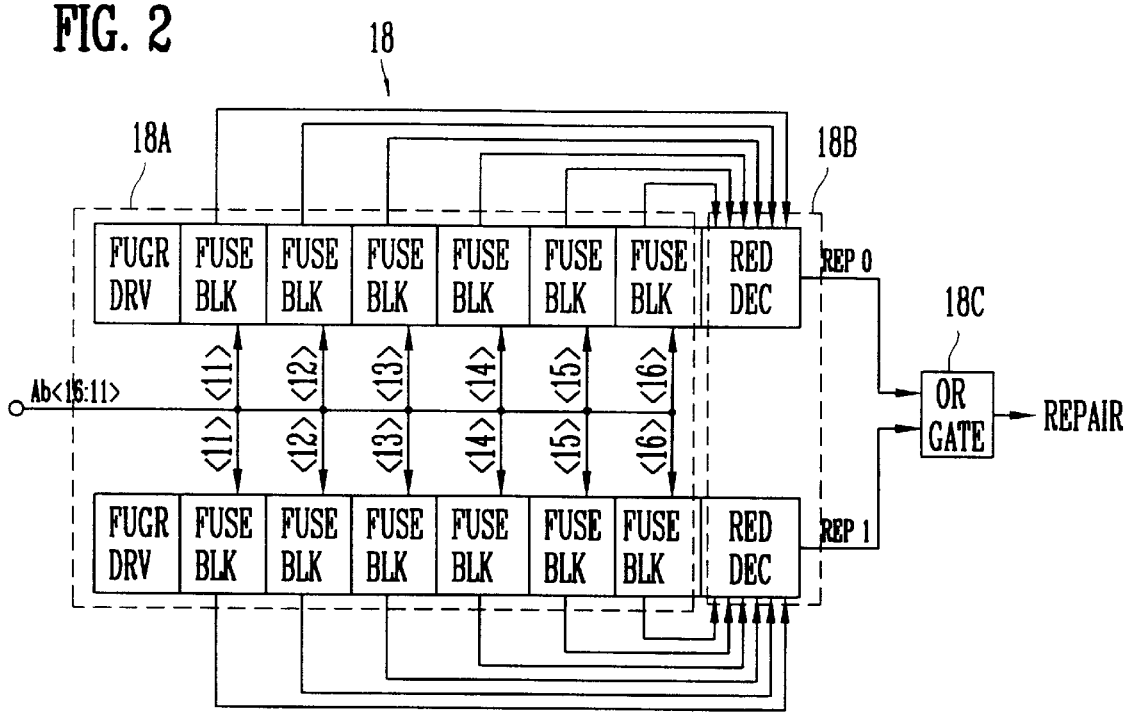
FIG. 2 is detailed block of the redundancy fuse block of FIG. 1.

FIG. 2 is a detailed block diagram of the redundancy fuse block of FIG. 1. The redundancy fuse block 18 is a comparing block which determines to repair an inputted address. The redundancy fuse block 18 is consisted of a fuse block 18A, a redundancy decoder block 18B and an OR gate 18C. The redundancy fuse block 18 determines whether data of the fuse block 18A and all addresses are matched or not through the redundancy decoder block 18B and the OR gate 18C after addresses are input and then outputs a repair signal.

Figure 3A:
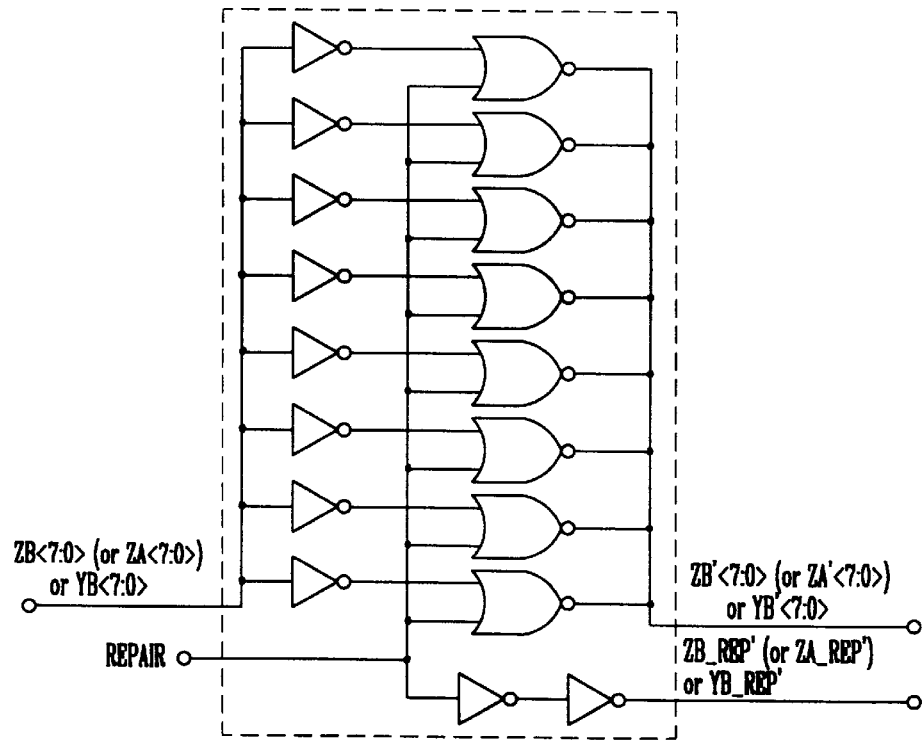
FIGS. 3A to 3C are detailed circuits of multiplex circuits used for a first to fifth repair multiplex blocks of FIG. 1.
Figure 3B:
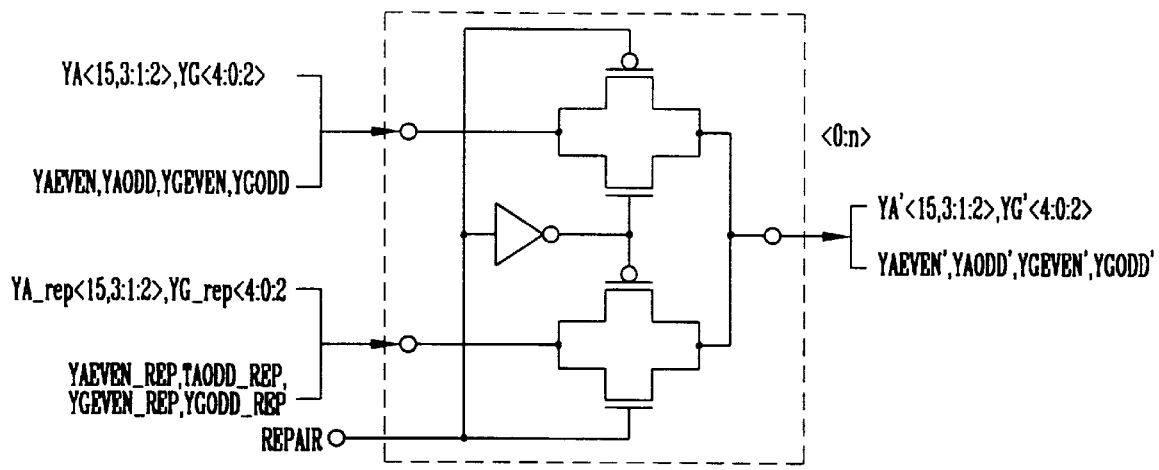
Figure 3C:
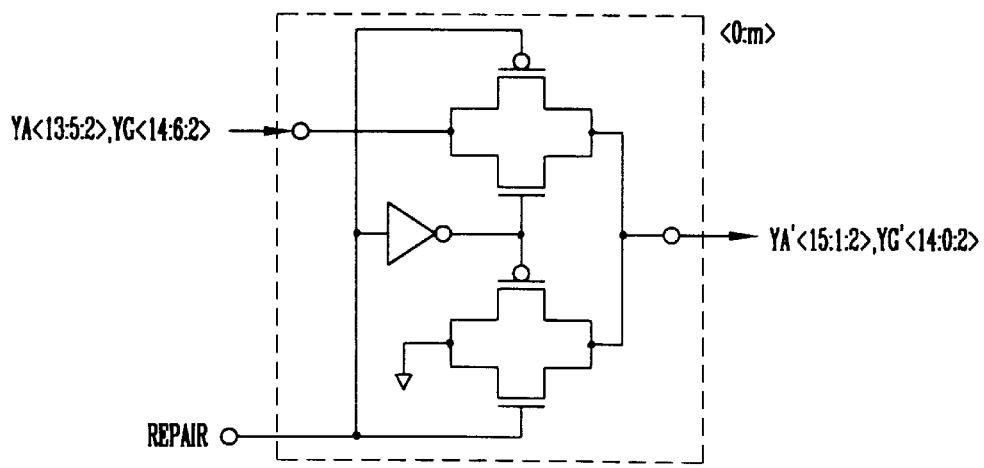

FIG. 3A is a detailed circuit of the first, second and fourth multiplexers, FIG. 3B is a detailed circuit of the fifth multiplexer and FIG. 3C is a detailed circuit of the third multiplexer. To access the main cell array of the cell array block 10 and the repair cell array, each of the first to fifth multiplexers 21 to 25 outputs selectively the coding signals which are decoded according to whether repair is done or not.

In the present invention as described above, a Y-decoder of the main cell is driven by the address in order to access the main cell and Y-decoder of the repair cell are driven in order to access the repair cell at the same time, and it is possible to reduce an access time by comparing an address input through the redundancy fuse block with the repair address and determining whether a repair is done or not.

The foregoing description, although described in its preferred embodiments with a certain degree of particularity, is only illustrative of the principle of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What is claimed is:

1. A flash memory device comprising;

a main cell array block consisted of a main cell array and a dummy cell array;

a first and second multiplex blocks to which data of said main cell array are input;

a first and second column multiplex blocks to which data of said main cell array block are input;

a first and second repair multiplexers to control said first and second multiplex blocks;

a third to fifth repair multiplexers to control said first and second column multiplex blocks;

a first to fifth decoders to access said main cell array of said cell array block according to an address input;

a sixth and seventh decoders to access repair cell array of said cell array block according to said address input; and a redundancy fuse block comparing said inputted address with repair address and determining whether repair will be done or not.

2. The flash memory device of claim 1, wherein said redundancy fuse block comprises;

a redundancy decoder to which an inputted address and the repair address of fuse block are input; and an OR gate comparing two outputted addresses said redundancy decoder, judging whether match will be done or not and outputting repair signal.

* * * * *